US011488805B2

(12) United States Patent
Brandon et al.

(10) Patent No.: US 11,488,805 B2
(45) Date of Patent: *Nov. 1, 2022

(54) MICROWAVE PLASMA REACTOR FOR MANUFACTURING SYNTHETIC DIAMOND MATERIAL

(71) Applicant: ELEMENT SIX TECHNOLOGIES LIMITED, Didcot (GB)

(72) Inventors: John Robert Brandon, Didcot (GB); Alexander Lamb Cullen, Didcot (GB); Stephen David Williams, Didcot (GB); Joseph Michael Dodson, Didcot (GB); Jonathan James Wilman, Didcot (GB); Christopher John Howard Wort, Didcot (GB)

(73) Assignee: Element Six Technologies Limited, Didcot (GB)

(*) Notice: Subject to any disclaimer, the term of this patent is extended or adjusted under 35 U.S.C. 154(b) by 0 days.

This patent is subject to a terminal disclaimer.

(21) Appl. No.: 16/457,138

(22) Filed: Jun. 28, 2019

(65) Prior Publication Data
US 2019/0318917 A1 Oct. 17, 2019

Related U.S. Application Data

(63) Continuation of application No. 13/994,880, filed as application No. PCT/EP2011/072824 on Dec. 14, 2011, now Pat. No. 10,403,477.
(Continued)

(30) Foreign Application Priority Data

Dec. 23, 2010 (GB) .................................... 1021865

(51) Int. Cl.
H01J 37/32 (2006.01)
C23C 16/27 (2006.01)
C23C 16/511 (2006.01)

(52) U.S. Cl.
CPC ...... *H01J 37/32458* (2013.01); *C23C 16/274* (2013.01); *C23C 16/511* (2013.01); *H01J 37/32192* (2013.01); *H01J 37/32284* (2013.01)

(58) Field of Classification Search
CPC ........... H01J 37/32458; H01J 37/32192; H01J 37/32284; H01J 37/32; C23C 16/274; C23C 16/511; C23C 16/27
(Continued)

(56) References Cited

U.S. PATENT DOCUMENTS 4,507,588 A 3/1985 Asmussen et al.
4,869,923 A 9/1989 Yamazaki
(Continued)

FOREIGN PATENT DOCUMENTS

CN 101385129 A 3/2009
EP 0343602 A2 11/1989
(Continued)

OTHER PUBLICATIONS

"Aluminium", http://web.archive.org/web/200501090953/http://en.wikipedia.org/wiki/Aluminum, 1 page.
(Continued)

*Primary Examiner* — Rudy Zervigon
(74) *Attorney, Agent, or Firm* — Kilpatrick Townsend & Stockton LLP

(57) ABSTRACT

A microwave plasma reactor for manufacturing synthetic diamond material via chemical vapour deposition includes a microwave generator configured to generate microwaves at a frequency f, a plasma chamber that defines a resonance cavity for supporting a microwave resonance mode, a micro-
(Continued)

wave coupling configuration for feeding microwaves from the microwave generator into the plasma chamber, a gas flow system for feeding process gases into the plasma chamber and removing them therefrom, and a substrate holder disposed in the plasma chamber and having a supporting surface for supporting a substrate on which the synthetic diamond material is to be deposited in use. The resonance cavity is configured to have a height that supports a $TM_{011}$ resonant mode at the frequency f and is further configured to have a diameter that satisfies the condition that a ratio of the resonance cavity height/the resonance cavity diameter is in the range 0.3 to 1.0.

16 Claims, 3 Drawing Sheets

Related U.S. Application Data

(60) Provisional application No. 61/439,313, filed on Feb. 3, 2011.

(58) Field of Classification Search
    USPC ............... 118/723 MW; 156/345.36, 345.41
    See application file for complete search history.

(56) References Cited

U.S. PATENT DOCUMENTS

| | | | |
|---|---|---|---|
| 4,877,642 A * | 10/1989 | Gartner | C23C 16/511 |
| | | | 427/575 |
| 4,989,542 A | 2/1991 | Kamo | |
| 5,069,928 A | 12/1991 | Echizen et al. | |
| 5,091,208 A | 2/1992 | Pryor | |
| 5,258,206 A | 11/1993 | Hayashi et al. | |
| 5,261,959 A | 11/1993 | Gasworth | |
| 5,273,731 A | 12/1993 | Anthony et al. | |
| 5,273,790 A | 12/1993 | Herb et al. | |
| 5,280,219 A | 1/1994 | Ghanbari | |
| 5,302,226 A | 4/1994 | Yamazaki et al. | |
| 5,302,803 A | 4/1994 | Stevens et al. | |
| 5,311,103 A | 5/1994 | Asmussen et al. | |
| 5,370,912 A | 12/1994 | Bigelow et al. | |
| 5,397,396 A | 3/1995 | Kosky et al. | |
| 5,433,789 A * | 7/1995 | Kakehi | C23C 16/511 |
| | | | 118/723 ME |
| 5,501,740 A | 3/1996 | Besen et al. | |
| 5,520,771 A | 5/1996 | Kanai et al. | |
| 5,643,365 A | 7/1997 | Blinov et al. | |
| 5,646,489 A * | 7/1997 | Kakehi | H01J 37/32229 |
| | | | 118/723 MR |
| 5,683,759 A | 11/1997 | Shepard, Jr. et al. | |
| 5,954,882 A | 9/1999 | Wild et al. | |
| 5,981,057 A | 11/1999 | Collins | |
| 6,020,579 A * | 2/2000 | Lewis | B01J 19/126 |
| | | | 219/690 |
| 6,091,045 A | 7/2000 | Mabuchi et al. | |
| 6,106,678 A | 8/2000 | Shufflebotham et al. | |
| 6,158,383 A | 12/2000 | Watanabe et al. | |
| 6,254,683 B1 | 7/2001 | Matsuda et al. | |
| 6,319,439 B1 | 11/2001 | Lee et al. | |
| 6,325,018 B1 | 12/2001 | Hongoh | |
| 6,388,632 B1 | 5/2002 | Murakawa et al. | |
| 6,414,338 B1 | 7/2002 | Anderson | |
| 6,427,621 B1 | 8/2002 | Ikegawa et al. | |
| 6,433,298 B1 | 8/2002 | Ishii | |
| 6,487,986 B1 | 12/2002 | Liehr et al. | |
| 6,565,661 B1 | 5/2003 | Nguyen | |
| 6,645,343 B1 | 11/2003 | Wild et al. | |
| 7,171,919 B2 | 2/2007 | Sohn et al. | |
| 9,637,838 B2 * | 5/2017 | Coe | C23C 16/274 |
| 10,403,477 B2 * | 9/2019 | Brandon | H01J 37/32192 |
| 2001/0023663 A1 | 9/2001 | Kazumi et al. | |
| 2001/0036465 A1 | 11/2001 | Ishll et al. | |
| 2003/0107003 A1 | 6/2003 | Whitehead | |
| 2003/0150561 A1 | 8/2003 | Ishii et al. | |
| 2003/0150846 A1 | 8/2003 | Ishii et al. | |
| 2003/0152700 A1 | 8/2003 | Asmussen et al. | |
| 2003/0200914 A1 | 10/2003 | Noguchi et al. | |
| 2004/0045674 A1 | 3/2004 | Ishii et al. | |
| 2004/0134431 A1 * | 7/2004 | Sohn | H01J 37/32192 |
| | | | 118/723 MW |
| 2005/0005853 A1 | 1/2005 | Behle et al. | |
| 2005/0109267 A1 | 5/2005 | Linares et al. | |
| 2005/0266606 A1 | 12/2005 | Chevallier et al. | |
| 2006/0266279 A1 | 11/2006 | Mokuno et al. | |
| 2007/0163996 A1 | 7/2007 | Horiguchi | |
| 2007/0221294 A1 | 9/2007 | Sasaki | |
| 2008/0099768 A1 | 5/2008 | Scarsbrook et al. | |
| 2008/0156256 A1 | 7/2008 | Linares et al. | |
| 2008/0190356 A1 | 8/2008 | Bhandari | |
| 2008/0303744 A1 | 12/2008 | Hirayama et al. | |
| 2010/0028556 A1 | 2/2010 | Linares et al. | |
| 2010/0034984 A1 | 2/2010 | Asmussen et al. | |
| 2010/0178234 A1 | 7/2010 | Noguchi | |
| 2010/0189924 A1 | 7/2010 | D'Evelyn et al. | |
| 2011/0024047 A1 | 2/2011 | Nguyen et al. | |
| 2014/0150713 A1 * | 6/2014 | Coe | H01J 37/32192 |
| | | | 117/88 |
| 2014/0230729 A1 * | 8/2014 | Brandon | C23C 16/511 |
| | | | 118/723 MW |

FOREIGN PATENT DOCUMENTS

| | | |
|---|---|---|
| EP | 0390209 A2 | 10/1990 |
| EP | 0447031 A1 | 9/1991 |
| EP | 0467043 A2 | 1/1992 |
| EP | 0480581 A1 | 4/1992 |
| EP | 0487292 A1 | 5/1992 |
| EP | 0526657 A1 | 2/1993 |
| EP | 0546752 A1 | 6/1993 |
| EP | 0582397 A2 | 2/1994 |
| EP | 0597445 A2 | 5/1994 |
| EP | 0695816 A1 | 2/1996 |
| EP | 0727507 A2 | 8/1996 |
| EP | 0758688 A1 | 2/1997 |
| EP | 0822269 A1 | 2/1998 |
| EP | 1500718 A1 | 1/2005 |
| EP | 1643641 A2 | 4/2006 |
| EP | 1463849 B1 | 1/2007 |
| EP | 2108714 A1 | 10/2009 |
| FR | 2798552 A1 | 3/2001 |
| JP | 62162366 A | 7/1987 |
| JP | 62167886 A | 7/1987 |
| JP | 62235393 A | 10/1987 |
| JP | H03281594 A | 12/1991 |
| JP | H049471 A | 1/1992 |
| JP | H04228495 A | 8/1992 |
| JP | H04238896 A | 8/1992 |
| JP | H0513342 A | 1/1993 |
| JP | 61251158 A | 9/1994 |
| JP | H08133893 A | 5/1996 |
| JP | 2001007385 A | 1/2001 |
| JP | 2002265296 A | 9/2002 |
| JP | 2003045810 A | 2/2003 |
| JP | 2003142471 A | 5/2003 |
| JP | 2004235434 A | 8/2004 |
| JP | 2004244298 A | 9/2004 |
| JP | 2005044822 A | 2/2005 |
| JP | 2006286269 A | 10/2006 |
| JP | 2007142195 A | 6/2007 |
| JP | 2007273913 A | 10/2007 |
| JP | 2007284773 A | 11/2007 |
| JP | 2007331955 A | 12/2007 |
| JP | 2009280421 A | 12/2009 |
| KR | 20020061768 A | 7/2002 |
| SE | 500740 C2 | 8/1994 |
| WO | 02077319 A1 | 10/2002 |
| WO | 03040440 A2 | 5/2003 |
| WO | 2006117621 A1 | 11/2006 |
| WO | 2006127611 A2 | 11/2006 |
| WO | 2007092893 A2 | 8/2007 |
| WO | 2008025899 A1 | 3/2008 |

(56) References Cited

FOREIGN PATENT DOCUMENTS

| WO | 2008029258 A2 | 3/2008 |
|----|---------------|--------|
| WO | 2008090510 A1 | 7/2008 |
| WO | 2008123605 A1 | 10/2008 |
| WO | 2010004836 A1 | 1/2010 |
| WO | 2010021382 A1 | 2/2010 |
| WO | 2010084655 A1 | 7/2010 |

OTHER PUBLICATIONS

Achard et al., "Thick Boron Doped Diamond Single Crystals for High Power Electronics", Diamond & Related Materials, vol. 20, No. 2, 2011, pp. 145-152, Elsevier B.V.

Alam et al., "Adhesion of diamond coatings on tungsten substrates", Journal of Adhesion Science and Technology, vol. 9, No. 6, 1995, pp. 653-679, VSP.

Asmussen et al., "Multiple substrate microwave plasma-assisted chemical vapor deposition single crystal diamond syntheses", Applied Physics Letters, vol. 93, No. 3, 2008, p. 031502-1 thru 031502-3, American Institute of Physics.

Balmer et al., "Chemical vapour deposition synthetic diamond: materials, technology and applications", Journal of Physics, vol. 21, No. 36, Aug. 19, 2009, pp. 1-23, IOP Publishing Ltd., UK.

Chae et al., "The 8-Inch free-standing CVD diamond wafer fabricated by DC-PACVD", Diamond & Related Materials, vol. 19, No. 10, 2010, pp. 1168-1171, Elsevier B.V.

Feng et al., "Surface stress measurement with interference microscopy of thick homoepitaxial single-crystal diamond layers", Diamond & Related Materials, vol. 19, No. 12, Dec. 2010, pp. 1453-1456, Elsevier B.V.

Funer et al., "Numerical simulations of microwave plasma reactors for diamond CVD", Surface and Coatings Technology, vols. 74-75, Part 1, 1995, pp. 221-226, Elsevier S.A.

Funer et al., "Simulation and development of optimized microwave plasma reactors for diamond deposition", Surface and Coatings Technology, vols. 116-119, 1999, pp. 853-862, Elsevier S.A.

Gray et al., "Free-standing CVD diamond wafers for thermal management by D.C. arc jet technology", Diamond & Related Materials, vol. 8, Nos. 2-5, Mar. 1999, pp. 903-908, Elsevier S.A.

Hassouni et al., "Modelling of diamond deposition microwave cavity generated plasmas", Journal of Applied Physics, vol. 43, No. 153001, 2010, 45 pages, IOP Publishing Ltd., UK and USA.

Hassouni et al., "Self-consistent microwave field and plasma discharge simulations for a moderate pressure hydrogen discharge reactor", Journal of Applied Physics, vol. 86, No. 1, Jul. 1, 1999, pp. 134-151, American Institute of Physics.

Hemawan et al., "Improved Microwave plasma cavity reactor for diamond synthesis at high-pressure and high power density", Diamond & Related Materials, vol. 19, No. 12, Dec. 2010, pp. 1446-1452, Elsevier B.V.

Kosky et al., "Fracture-free release of CVD diamond", Diamond and Related Materials, vol. 5, No. 11, Nov. 1996, pp. 1313-1317, Elsevier S.A.

Lee et al., "Single-Cathode DC PACVD Process for LargeArea CVD Diamond Wafer Fabrication", 203rd Meeting of the Electrochemical Society, Eighth International Symposium on Diamond Materials, 2003, 2 pages.

Liao, "Microwave Devices and Circuits", 3d Edition, 1996, pp. 144-156, Prentice-Hall, Inc., New Jersey.

Popov, "High Density Plasma Sources: Design, Physics and Performance", 1996, pp. 258-295, Noyes Publications.

Silva et al., "Microwave analysis of PACVD diamond deposition reactor based on electromagnetic modelling", Diamond & Related Materials, vol. 19, 2010, pp. 397-403, Elsevier B.V.

Silva et al., "Microwave Engineering of Plasma-Assisted CVD Reactors for Diamond Deposition", Journal of Physics, vol. 21, No. 364202, 2009, 16 pages, IOP Publishing Ltd.

Whitfield et al., "Nucleation and Growth of diamond films on single crystal and polycrystalline tungsten substrates", Diamond and Related Materials, vol. 9, No. 366, 2000, pp. 262-268, Elsevier S.A.

Yamada et al., "Simulation with an improved plasma model utilized to design a new structure of microwave plasma discharge for chemical vapor deposition of diamond crystals", Diamond and Related Materials, vol. 17, Nos. 4-5, Apr.-May 2008, pp. 494-497, Elsevier B.V.

International Patent Application No. PCT/EP2011/072818, "International Search Report and Written Opinion", dated Jun. 22, 2012, 25 pages.

International Patent Application No. PCT/EP2011/072820, "International Search Report and Written Opinion", dated Mar. 30, 2012, 10 pages.

International Patent Application No. PCT/EP2011/072821, "International Search Report and Written Opinion", dated Feb. 3, 2012, 9 pages.

International Patent Application No. PCT/EP2011/072822, "International Search Report and Written Opinion", dated May 23, 2012, 14 pages.

International Patent Application No. PCT/EP2011/072823, "International Search Report and Written Opinion", dated Jul. 4, 2012, 19 pages.

International Patent Application No. PCT/EP2011/072824, "International Search Report and Written Opinion", dated May 3, 2012, 10 pages.

International Patent Application No. PCT/EP2011/072825, "International Search Report and Written Opinion", dated Mar. 30, 2012, 9 pages.

United Kingdom Patent Application No. GB1021853.5, "Search Report", dated Mar. 30, 2011, 2 pages.

United Kingdom Patent Application No. GB1021855.0, "Search Report", dated May 31, 2011, 2 pages.

United Kingdom Patent Application No. GB1021860.0, "Search Report", dated Apr. 20, 2011, 2 pages.

United Kingdom Patent Application No. GB1021865.9, "Search Report", dated Apr. 20, 2011, 2 pages.

United Kingdom Patent Application No. GB1021870.9, "Search Report", dated Apr. 6, 2011, 2 pages.

United Kingdom Patent Application No. GB1021913.7, "Search Report", dated Apr. 21, 2011, 2 pages.

United Kingdom Patent Application No. GB1121474.9, "Search Report", dated Mar. 27, 2012, 2 pages.

United Kingdom Patent Application No. GB1121486.3, "Search Report", dated Apr. 12, 2012, 2 pages.

United Kingdom Patent Application No. GB1121492.1, "Search Report", dated Apr. 12, 2012, 2 pages.

United Kingdom Patent Application No. GB1121494.7, "Search Report", dated Apr. 12, 2012, 2 pages.

United Kingdom Patent Application No. GB1121499.6, "Search Report", dated Jan. 27, 2012, 2 pages.

United Kingdom Patent Application No. GB1121505.0, "Search Report", dated Mar. 29, 2012, 1 page.

United Kingdom Patent Application No. GB1121517.5, "Search Report", dated Mar. 27, 2012, 2 pages.

United Kingdom Patent Application No. GB1305030.7, "Search Report", dated Apr. 16, 2013, 1 page.

United Kingdom Patent Application No. GB1305041.4, "Search Report", dated Apr. 15, 2013, 2 pages.

United Kingdom Patent Application No. GB1305045.5, "Search Report", dated Apr. 16, 2013, 1 page.

U.S. Appl. No. 13/994,880, "Restriction Requirement", dated Jul. 28, 2016, 7 pages.

U.S. Appl. No. 13/994,880, "Non-Final Office Action", dated Oct. 19, 2016, 16 pages.

U.S. Appl. No. 13/994,880, "Final Office Action", dated Mar. 30, 2017, 16 pages.

U.S. Appl. No. 13/994,880, "Advisory Action", dated Sep. 7, 2017, 3 pages.

U.S. Appl. No. 13/994,880, "Non-Final Office Action", dated Dec. 5, 2017, 16 pages.

U.S. Appl. No. 13/994,880, "Final Office Action", dated May 11, 2018, 16 pages.

U.S. Appl. No. 13/994,880, "Final Office Action", dated May 30, 2018, 17 pages.

(56) References Cited

OTHER PUBLICATIONS

U.S. Appl. No. 13/994,880 , "Notice of Allowance", dated Apr. 3, 2019, 11 pages.

* cited by examiner

MICROWAVE PLASMA REACTOR FOR MANUFACTURING SYNTHETIC DIAMOND MATERIAL

CROSS-REFERENCE TO RELATED APPLICATIONS

This application is a continuation of U.S. patent application Ser. No. 13/994,880, filed on Apr. 25, 2014, which is a U.S. national phase of International Patent Application No. PCT/EP2011/072824, filed on Dec. 14, 2011, which claims the benefit of U.S. Provisional Patent Application No. 61/439,313, filed on Feb. 3, 2011, and United Kingdom Patent Application No. 1021865.9, filed on Dec. 23, 2010, each of which is incorporated herein by reference in its entirety.

FIELD OF INVENTION

The present invention relates to a microwave plasma reactor for manufacturing synthetic diamond material using chemical vapour deposition techniques.

BACKGROUND OF INVENTION

Chemical vapour deposition (CVD) processes for synthesis of diamond material are now well known in the art. Useful background information relating to the chemical vapour deposition of diamond materials may be found in a special issue of the Journal of Physics: Condensed Matter, Vol. 21, No. 36 (2009) which is dedicated to diamond related technology. For example, the review article by R. S Balmer et al. gives a comprehensive overview of CVD diamond materials, technology and applications (see "Chemical vapour deposition synthetic diamond: materials, technology and applications" J. Phys.: Condensed Matter, Vol. 21, No. 36 (2009) 364221).

Being in the region where diamond is metastable compared to graphite, synthesis of diamond under CVD conditions is driven by surface kinetics and not bulk thermodynamics. Diamond synthesis by CVD is normally performed using a small fraction of carbon (typically <5%), typically in the form of methane although other carbon containing gases may be utilized, in an excess of molecular hydrogen. If molecular hydrogen is heated to temperatures in excess of 2000 K, there is a significant dissociation to atomic hydrogen. In the presence of a suitable substrate material, synthetic diamond material can be deposited.

Atomic hydrogen is essential to the process because it selectively etches off non-diamond carbon from the substrate such that diamond growth can occur. Various methods are available for heating carbon containing gas species and molecular hydrogen in order to generate the reactive carbon containing radicals and atomic hydrogen required for CVD diamond growth including arc-jet, hot filament, DC arc, oxy-acetylene flame, and microwave plasma.

Methods that involve electrodes, such as DC arc plasmas, can have disadvantages due to electrode erosion and incorporation of material into the diamond. Combustion methods avoid the electrode erosion problem but are reliant on relatively expensive feed gases that must be purified to levels consistent with high quality diamond growth. Also the temperature of the flame, even when combusting oxy-acetylene mixes, is insufficient to achieve a substantial fraction of atomic hydrogen in the gas stream and the methods rely on concentrating the flux of gas in a localized area to achieve reasonable growth rates. Perhaps the principal reason why combustion is not widely used for bulk diamond growth is the cost in terms of kWh of energy that can be extracted. Compared to electricity, high purity acetylene and oxygen are an expensive way to generate heat. Hot filament reactors while appearing superficially simple have the disadvantage of being restricted to use at lower gas pressures which are required to ensure relatively effective transport of their limited quantities of atomic hydrogen to a growth surface.

In light of the above, it has been found that microwave plasma is the most effective method for driving CVD diamond deposition in terms of the combination of power efficiency, growth rate, growth area, and purity of product which is obtainable.

A microwave plasma activated CVD diamond synthesis system typically comprises a plasma reactor vessel coupled both to a supply of source gases and to a microwave power source. The plasma reactor vessel is configured to form a resonance cavity supporting a standing microwave. Source gases including a carbon source and molecular hydrogen are fed into the plasma reactor vessel and can be activated by the standing microwave to form a plasma in high field regions. If a suitable substrate is provided in close proximity to the plasma, reactive carbon containing radicals can diffuse from the plasma to the substrate and be deposited thereon. Atomic hydrogen can also diffuse from the plasma to the substrate and selectively etch off non-diamond carbon from the substrate such that diamond growth can occur.

A range of possible microwave plasma reactors for synthetic diamond film growth using a CVD process are known in the art. Such reactors have a variety of different designs. Common features include: a plasma chamber; a substrate holder disposed in the plasma chamber; a microwave generator for forming the plasma; a coupling configuration for feeding microwaves from the microwave generator into the plasma chamber; a gas flow system for feeding process gases into the plasma chamber and removing them therefrom; and a temperature control system for controlling the temperature of a substrate on the substrate holder.

A useful overview article by Silva et al. summarizing various possible reactor designs is given in the previous mentioned Journal of Physics (see "Microwave engineering of plasma-assisted CVD reactors for diamond deposition" J. Phys.: Condens. Matter, Vol. 21, No. 36 (2009) 364202). This article identifies that from a purely electromagnetic standpoint, there are three main design criteria: (i) the choice of the resonant mode; (ii) the choice of the coupling structure (electric or magnetic); and (iii) the choice of dielectric window (shape and location).

Having regard to point (i), Silva et al. identify that circular transverse magnetic (TM) modes, and particularly $TM_{0mn}$ modes, are most suitable. In this notation, the first index number (here 0) indicates that the electric field structure is axisymmetric, which will yield a circular plasma. The indices m and n represent the number of nodes in the electric field in the radial and axial directions, respectively. Silva et al indicate that a number of different modes have been used in prior art reactors including: $TM_{011}$; $TM_{012}$; $TM_{013}$; $TM_{020}$, $TM_{022}$; $TM_{023}$; and $TM_{031}$.

Having regard to point (ii), Silva et al. identify that electric field (capacitive) coupling using an antenna is the most widely used and that magnetic (inductive) coupling is rarely used because of the limited power than can be coupled. That said, a commercially available IPLAS reactor is disclosed as using magnetic coupling to support a $TM_{012}$ mode.

Having regard to point (iii), Silva et al. describe that an essential element associated with both electric and magnetic coupling schemes is a dielectric window which is generally made of quartz and delimits a reduced pressure zone inside the cavity in which reactant gases are fed to form a plasma when excited by the electromagnetic field. It is described that the use of a quartz window allows a user to select a single electric field anti-node region (of maximum electric field) such that the plasma can be ignited only in this region and the formation of parasitic plasma at other electric field maxima within the chamber can be avoided. The quartz window is conventionally in the form of a bell-jar placed over the substrate on which deposition is to occur and around an electric field anti-node located adjacent the substrate. Other dielectric window configurations are also disclosed. For example, an ASTEX reactor is described which includes a dielectric window in the form of a plate located across the reactor chamber approximately at the cavity mid-plane while a second-generation ASTEX reactor is described as having a dielectric window in the form of a quartz tube which is not directly exposed to the plasma so as to give the reactor better power handling capabilities.

In addition, the article discloses various geometries of prior art reactor chambers including: a cylindrical chamber such as the MSU reactor which is designed to support a $TM_{012}$ mode, the ASTEX reactor which is designed to support a $TM_{013}$ mode, or LIMHP reactor designs supporting a $TM_{023}$ mode or a $TM_{022}$ mode; an ellipsoidal chamber such as the AIXTRON reactor; and other non-cylindrical chambers such as the second generation ASTEX reactor which has a central cylindrical component purported to support a $TM_{011}$ mode between the substrate holder and a top portion of the chamber and laterally extending side lobes supporting a $TM_{021}$ mode so that the chamber as a whole supports multiple modes. The second generation ASTEX reactor has only one $E_z$-field maximum in the upper part of the central section of the chamber which is the case for a $TM_{11}$ mode, but two $E_z$ maxima in its lower half, as expected for a $TM_{021}$ mode.

Having regard to the patent literature, U.S. Pat. No. 6,645,343 (Fraunhofer) discloses an example of a microwave plasma reactor configured for diamond film growth via a chemical vapour deposition process. The reactor described therein comprises a cylindrical plasma chamber with a substrate holder mounted on a base thereof. A cooling device is provided below the substrate holder for controlling the temperature of a substrate on the substrate holder. Furthermore, a gas inlet and a gas outlet are provided in the base of the plasma chamber for supplying and removing process gases. A microwave generator is coupled to the plasma chamber via a high-frequency coaxial line which is subdivided at its delivery end above the plasma chamber and directed at the periphery of the plasma chamber to an essentially ring-shaped microwave window in the form of a quartz ring. The invention as described in U.S. Pat. No. 6,645,343 focuses on the ring-shaped microwave window and discloses that the coupling of microwaves in the reactor chamber is distributed in circularly symmetric fashion over the entire ring surface of the microwave window. It is taught that because the coupling is distributed over a large surface, high microwave power levels can be coupled without high electric field intensities developing at the microwave window thus reducing the danger of window discharge.

As such, U.S. Pat. No. 6,645,343 addresses two of the three design criteria described by Silva et al. in their Journal of Physics article discussed previously, i.e., the choice of the coupling structure (magnetic) and the choice of dielectric window (ring-shaped dielectric widow located around the side wall of a cylindrical reactor chamber). U.S. Pat. No. 6,645,343 is silent as to what resonant mode the chamber should be design to support and what design criteria should be applied to the chamber in order to best support the desired resonance mode to achieve a uniform, stable, large area plasma across the surface of a large area substrate/holder for achieving uniform CVD diamond growth over large areas.

It light of the above discussion and the prior art mentioned therein, it will be evident that it is a well known aim in the field of CVD diamond synthesis to form a uniform, stable, large area plasma across the surface of a large area substrate/ holder for achieving uniform CVD diamond growth over large areas and that many different plasma chamber designs and power coupling configurations have been proposed in the art for trying to achieve this goal. However, there is an on going need to improve upon the prior art arrangements in order to provide larger CVD growth areas, better uniformity, higher growth rates, better reproducibility, better power efficiency and/or lower production costs. It is an aim of certain embodiments of the present invention to address this on going need.

SUMMARY OF INVENTION

According to a first embodiment of the present invention there is provided a microwave plasma reactor for manufacturing synthetic diamond material via chemical vapour deposition, the microwave plasma reactor comprising:

a microwave generator configured to generate microwaves at a frequency f;

a plasma chamber comprising a base, a top plate, and a side wall extending from said base to said top plate defining a resonance cavity for supporting a microwave resonance mode, wherein the resonance cavity has a central rotational axis of symmetry extending from the base to the top plate, and wherein the top plate is mounted across said central rotational axis of symmetry;

a microwave coupling configuration for feeding microwaves from the microwave generator into the plasma chamber;

a gas flow system for feeding process gases into the plasma chamber and removing them therefrom; and a substrate holder disposed in the plasma chamber and comprising a supporting surface for supporting a substrate on which the synthetic diamond material is to be deposited in use;

wherein the resonance cavity is configured to have a height, as measured from the base to the top plate of the plasma chamber, which supports a $TM_{011}$ resonant mode between the base and the top plate at said frequency f, and wherein the resonance cavity is further configured to have a diameter, as measured at a height less than 50% of the height of the resonance cavity as measured from the base, which satisfies the condition that a ratio of the resonance cavity height/the resonance cavity diameter is in the range 0.3 to 1.0.

According to a second embodiment of the present invention there is provided a microwave plasma reactor for manufacturing synthetic diamond material via chemical vapour deposition, the microwave plasma reactor comprising:

a plasma chamber comprising a base, a top plate, and a side wall extending from said base to said top plate defining a resonance cavity for supporting a microwave resonance mode, wherein the resonance cavity has a central rotational axis of symmetry extending from the base to the top plate, and wherein the top plate is mounted across said central rotational axis of symmetry;

a microwave coupling configuration for feeding microwaves from a microwave generator into the plasma chamber;

a gas flow system for feeding process gases into the plasma chamber and removing them therefrom; and a substrate holder disposed in the plasma chamber and comprising a supporting surface for supporting a substrate on which the synthetic diamond material is to be deposited in use;

wherein the resonance cavity is configured to have a height, as measured from the base to the top plate of the plasma chamber, which supports a $TM_{011}$ resonant mode between the base and the top plate at a frequency in the range 400 to 500 MHz, 800 to 1000 MHz, or 2300 to 2600 Mz, and wherein the resonance cavity is further configured to have a diameter, as measured at a height less than 50% of the height of the resonance cavity as measured from the base, which satisfies the condition that a ratio of the resonance cavity height/the resonance cavity diameter is in the range 0.3 to 1.0.

According to a third embodiment of the present invention there is provided a method of manufacturing synthetic diamond material using a chemical vapour deposition process, the method comprising:

providing a microwave plasma reactor as described above;

locating a substrate over the substrate holder; feeding microwaves into the plasma chamber;

feeding process gases into the plasma chamber; and forming synthetic diamond material on the substrate.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

Figure 1:
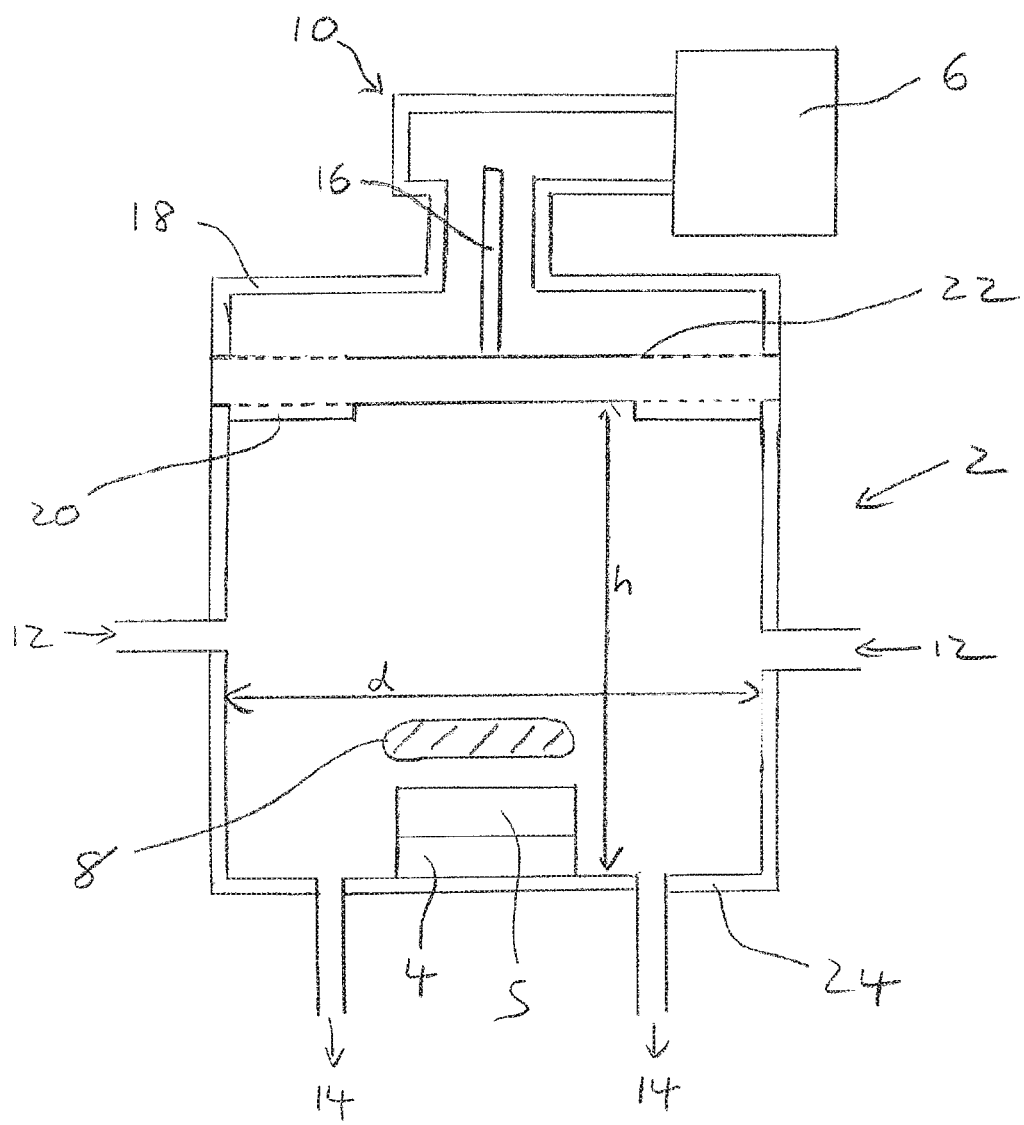
FIG. 1 shows a cross-sectional view of a microwave plasma reactor configured to deposit synthetic diamond material using a chemical vapour deposition technique in accordance with an embodiment of the present invention.

The present inventors have considered a number of reactor design criteria in order to try and achieve one or more of the following advantageous technical effects: larger area CVD diamond growth; better CVD diamond uniformity across the growth area; higher growth rates; better reproducibility; better power efficiency; and/or lower production costs. The design criteria include: (1) resonance mode and chamber geometry; (2) microwave coupling structure, dielectric window shape and location; and (3) configurations for stabilizing the plasma formed within the reactor chamber. These design criteria are discussed in turn below.

Resonance Mode and Chamber Geometry

Certain embodiments of the present invention are based on the seemingly counter-intuitive finding that it is advantageous to use a plasma reactor chamber having a relatively small diameter to form a uniform, stable, large area plasma for achieving uniform CVD diamond growth over large areas.

The present inventors have noted that large diameter chambers can support several, or indeed many, resonance modes. It has been further noted that these modes can interact. The present inventors consider that even a weak interaction is a problem. If a parasitic mode exists at even a few percent of the main resonant mode it can be sufficient to disrupt the plasma uniformity. The present inventors have found that if the diameter of the plasma chamber is too large this can lead to poorer plasma stability with a tendency for the plasma to 'jump'. The alternative, however, is that the chamber diameter becomes too small and the plasma becomes compressed and non-uniform across the substrate.

Furthermore, the present inventors consider that a cavity formed within a specific, relatively small, diameter range allows the formation of localized higher order axisymmetric modes at the substrate making the E-field across the substrate more uniform without forming very intense radial E-fields at the top corners of the substrate. It should be noted that these localized higher order axisymmetric modes are distinct from the disruptive parasitic modes discussed previously which are supported across the chamber as a whole and which undesirably disrupt the primary microwave mode of the resonance cavity.

Further still, the present inventors also consider that it is advantageous to provide a resonance cavity having a relatively low Q factor. The Q factor of a resonance cavity is the ratio of energy stored/energy dissipated per cycle. The present inventors consider that for CVD diamond synthesis the Q factor of the plasma chamber in use (i.e. with plasma present in the plasma chamber) should be relatively low (e.g. less than 1000, 500, 200, 100, 80, 50, 30, or 20). That is, the resonance cavity is weakly resonant and is highly damped, with a high rate of energy loss. Such cavities have a larger range of frequencies at which they will resonate and thus operate at larger bandwidths. The Q factor may be modified by modifying the volume of the chamber and the volume and conductivity of the plasma. A small, weakly conductive plasma in a large cavity might be expected to have a higher Q factor than a large volume plasma in a small cavity. Accordingly, a small cavity with a large plasma volume is considered preferable for this additional reason. This condition can most readily be achieved by providing a plasma chamber with a relatively small diameter (as the height of the cavity must be selected to support a standing microwave).

The Q factor of the microwave cavity may be important for several reasons. First, the microwave source will produce power over a spectrum of frequencies and will vary from source to source. For the reactor to be able to operate across that range of frequencies without any other adjustments to the matching network it is apparent that a low Q factor can be advantageous. Secondly, the plasma itself affects the resonant frequency and matching of the chamber from its unloaded condition as the complex permittivity of even a weakly ionized plasma is different from that of an un-ionized gas. Optimally, a compromise must be reached whereby the plasma can be excited in the cavity without having to make adjustments to the matching network as it is set during normal operation. Thirdly, a high Q cavity (and matching network) will show a large change in phase and magnitude of reflection with frequency. This means that the source frequency becomes critical in determining how much power is coupled into the plasma. Changes in the frequency of the source can occur for a variety of reasons and high Q cavities will be less tolerant of any small differences in manufacturing tolerances.

With the above in mind, the present inventors consider that it is advantageous to use a relatively small diameter cavity in order to provide the following beneficial technical effects:

(i) Improve resonance mode purity within the chamber and avoid complex interactions between numerous modes during operation over the long time-scales required for CVD diamond synthesis. For example, a small diameter chamber can reduce the problem of slight temperature instabilities in the CVD diamond growth surface stimulating an unwelcome higher order mode.

(ii) A cavity formed within a specific, relatively small, diameter range is considered to allow the formation of localized higher order axis-symmetric modes at the substrate making the E-field across the substrate more uniform without forming very intense radial E-fields at the top corners of the substrate.

(iii) A small diameter cavity which has a relatively low Q factor is more easy to start and tune, and is less sensitive to variations in microwave source frequency.

Such a relatively small diameter cavity also helps to alleviate the problem of complex and interacting gas convection currents forming within the chamber leading to plasma instability. That is, the present inventors consider that a small diameter cavity provides a more simple and easier to control system in terms of both gas flow and microwave power within the plasma chamber such that a more uniform, stable, large area plasma can be formed and maintained to achieve uniform CVD diamond growth over large areas. At the same time, the diameter of the cavity should not be so small that the plasma becomes compressed and non-uniform across the substrate.

So, the question remains as to what shape and dimensions the chamber should actually have to fulfil the aforementioned requirements.

Having regard to the aforementioned discussion, the shape and dimensions of the chamber will be dependent on: (i) the frequency of the microwaves; (ii) the desired standing wave mode; and (iii) the desired Q factor for the chamber.

Having regard to microwave frequency, there are two standard frequencies of generator used in the UK: 2450 MHz and 896 MHz (in mainland Europe, the Americas and Asia, the lower frequency standard is 915 MHz, in Australia it is 922 MHz). Decreasing the frequency by a factor of 2.7 from 2450 MHz to 896 MHz will allow a scale up in CVD deposition diameter of the order 2.7 for a given mode structure. Accordingly, the lower standard frequency is preferred for larger area deposition. The choice of other permitted bands, e.g. 433 MHz, is also possible. In some respects, a lower frequency of, for example, 433 MHz is advantageous for achieving even larger area CVD diamond deposition. Thus, decreasing the frequency by a factor of 2.07 from 896 MHz to 433 MHz will allow a scale up in CVD deposition diameter of the order of 2.07.

Having regard to the desired mode, as it is desired to create a concentration in the E component of the electric field (an anti-node point) at or immediately above the substrate to activate a plasma in this region, it is considered preferable to use a transverse magnetic rather than a transverse electric mode as the latter cannot generate a high electric field axisymmetrically at a conductive surface oriented transverse to the direction of propagation.

It has been found that using a $TM_{011}$ mode is advantageous as it has been found to be the most compact (small) mode which can be practicably used in a diamond CVD plasma reactor. A $TM_{011}$ standing wave may be formed to be a half wavelength with a node in the centre of the chamber and an anti-node at the base of the chamber over the substrate and an anti-node at the top of the chamber. This low order mode has the additional advantage of a large frequency separation to other modes, when compared with the frequency separation of higher order modes, thus reducing the likelihood of hopping between different modes. As such, the $TM_{011}$ has also been found to be advantageous in terms of mode purity and stability for this reason.

For the $TM_{011}$ mode, and taking into account the previous discussion, a microwave plasma reactor for manufacturing synthetic diamond material may comprise:

a microwave generator configured to generate microwaves at a frequency f;

a plasma chamber comprising a base, a top plate, and a side wall extending from said base to said top plate defining a resonance cavity for supporting a microwave resonance mode, wherein the resonance cavity has a central rotational axis of symmetry extending from the base to the top plate, and wherein the top plate is mounted across said central rotational axis of symmetry;

a microwave coupling configuration for feeding microwaves from the microwave generator into the plasma chamber;

a gas flow system for feeding process gases into the plasma chamber and removing them therefrom; and a substrate holder disposed in the plasma chamber and comprising a supporting surface for supporting a substrate on which the synthetic diamond material is to be deposited in use;

wherein the resonance cavity is configured to have a height, as measured from the base to the top plate of the plasma chamber, which supports a $T_{011}$ resonant mode between the base and the top plate at said frequency f, and wherein the resonance cavity is further configured to have a diameter, as measured at a height less than 50%, 40%, 30%, 20%, or 10% of the height of the resonance cavity as measured from the base, which satisfies the condition that a ratio of the resonance cavity height/the resonance cavity diameter is in the range 0.3 to 1.0.

Such a design has been found to be useful in creating a larger, more uniform plasma than other configurations for CVD diamond synthesis. It has been found that using a reactor as defined above allows a substrate of the order of 150 mm in diameter to be covered with a uniform plasma to form very high quality, uniform CVD diamond material over the entire area at a fast growth rate. Surprisingly, when compared to many different, and in most cases more complex, reactor designs, the seemingly more compact and simple design described herein has been found to be advantageous for CVD diamond synthesis. Furthermore, the present invention is completely contrary to the general direction taken by practitioners in this field who have moved towards the use of larger plasma chambers, having more complex geometries in an attempt to meet the aim of achieving high quality, uniform CVD diamond growth over larger areas. For example, only one prior art reactor described by Silva et al. discloses the use of a $TM_{011}$ mode, the second-generation ASTEX reactor. The present reactor design is distinguished over the second-generation ASTEX reactor by two key features: (i) the $TM_{011}$ mode is defined as being supported between the base and top plate of the resonance cavity (rather than between a substrate table and a top plate as in the second-generation ASTEX design); and (ii) the diameter of the resonance cavity in at least a lower portion of the resonance cavity satisfies the condition that a ratio of the resonance cavity height/the resonance cavity diameter is in the range 0.3 to 1.0 (this requires the diameter of the cavity to be relatively narrow in contrast to the ASTEX design which has a very broad chamber having laterally extending portions designed to support a $TM_{021}$ mode). As such, the ASTEX design goes completely against the inventive concept of embodiments of the present invention which is to form a narrow, compact resonance cavity with a $TM_{011}$ mode supported between a base and top plate of the plasma chamber.

Certain embodiments of the present invention have been found to have the following advantageous features: (i) improved resonance mode purity within the plasma chamber thereby limiting complex, uncontrollable interactions between numerous modes during operation over the long time-scales required for CVD diamond synthesis; (ii) improved control of localized higher order axis-symmetric modes at the substrate making the E-field across the substrate more uniform without forming very intense radial E-fields at the top corners of the substrate; (iii) improved gas flow control (e.g. the small, simple chamber design can reduce adverse convection currents within the chamber leading to non-uniform CVD diamond growth); and (iv) improved start-up and tuning capabilities (e.g. by providing a low Q-factor resonance cavity). The first three points are believed to be important for achieving high quality, uniform CVD diamond growth over large areas whereas the final point is important for providing a robust industrial process.

Optionally, the ratio of the resonance cavity height/the resonance cavity diameter is in the range 0.4 to 0.9 or 0.5 to 0.8. For example, the resonance cavity height as measured from the base to the top plate of the plasma chamber may be in the range 150 mm to 300 mm, 150 mm to 250 mm, or 200 mm to 250 mm. Furthermore, optionally the resonance cavity diameter may be in the range 200 mm to 500 mm, 250 mm to 450 mm, or 300 mm to 400 mm. These dimensions are particularly preferred for operation at a microwave frequency in the range 800 MHz to 1000 MHz. However, the previously discussed requirement for the resonance cavity height to resonance cavity diameter ratio to be within the stated limitations holds for alternative operating frequencies such as those in the range 400 MHz to 500 MHz or 2300 MHz to 2600 MHz. Accordingly, the resonance cavity may be configured to have a height, as measured from the base to the top plate of the plasma chamber, which supports an approximately cylindrical $TM_{011}$ resonant mode between the base and the top plate at a frequency within ±50 MHz of the frequency f of the microwave generator. For an operational frequency in the range 2300 MHz to 2600 MHz, the resonance cavity height as measured from the base to the top plate of the plasma chamber may be in the range 50 mm to 110 mm, 50 mm to 90 mm, or 70 mm to 90 mm. The resonance cavity diameter at this operational frequency may be in the range 70 mm to 180 mm, 90 mm to 160 mm, or 110 mm to 150 mm. For an operational frequency in the range 400 MHz to 500 MHz, the resonance cavity height as measured from the base to the top plate of the plasma chamber may be in the range 300 mm to 600 mm, 300 mm to 500 mm, or 400 mm to 500 mm. The resonance cavity diameter at this operational frequency may be in the range 400 mm to 1000 mm, 500 mm to 900 mm, or 600 mm to 800 mm.

According to one configuration, the resonance cavity is cylindrical. That is, the side wall of the resonance cavity has a substantially uniform diameter over a majority (e.g. greater than 50%, 60%, 70%, 80%, 90%, or 95%) of its height from base to top plate. This differs considerably from the ASTEX configuration which has a widely varying diameter leading to the possibility of complex multi-mode interactions in a lower portion of the chamber where the substrate holder is disposed.

Alternatively, the side wall of the plasma chamber may be tapered outwardly towards the top plate of the resonance cavity in at least an upper portion of the resonance cavity at a height greater than 50% of the height of the resonance cavity to reduce the strength of a high electric-field anti-node in an upper portion of the resonance cavity in use. Again, this differs considerably from the ASTEX configuration which has a larger diameter in a lower portion of the plasma chamber and a narrower diameter in an upper portion of the chamber. In the present alternative arrangement, a ratio of a lower diameter/an upper diameter of the resonance cavity may be greater than 0.4 and less than 1, wherein the lower diameter is measured at a height less than 50% of the height of the resonance cavity and the upper diameter is measured at a height greater than 50% of the height of the resonance cavity as measured from the base. Optionally, the ratio may be in a range 0.5 to 0.9, 0.6 to 0.9, or 0.7 to 0.8. For example, the lower diameter may lie in a range 200 mm to 450 mm, 250 mm to 450 mm, 300 mm to 400 mm, or 330 mm to 400 mm, and the upper diameter may lie in a range 300 mm to 500 mm, 350 mm to 500 mm, 350 mm to 450 mm, or 400 mm to 450 mm. These dimensions are particularly preferred for operation at a microwave frequency in the range 800 MHz to 1000 MHz. For an operating frequency of 400 to 500 MHz, the lower diameter may lie in a range 400 mm to 900 mm, 500 mm to 900 mm, 600 mm to 800 mm, or 650 mm to 800 mm, and the upper diameter may lie in a range 600 mm to 1000 mm, 700 mm to 1000 mm, 700 mm to 900 mm, or 800 mm to 900 mm. For an operating frequency of 2300 to 2600 MHz, the lower diameter may lie in a range 70 mm to 160 mm, 90 mm to 160 mm, 100 mm to 150 mm, or 120 mm to 150 mm, and the upper diameter may lie in a range 100 mm to 200 mm, 120 mm to 200 mm, 130 mm to 170 mm, or 150 mm to 170 mm.

The low diameter resonant cavities described above will result in a relatively large ratio of plasma volume to chamber volume in use. The volume of the resonance cavity may be in a range 0.002 $m^3$ to 0.060 $m^3$, 0.007 $m^3$ to 0.040 $m^3$, 0.010 $m^3$ to 0.030 $m^3$, or 0.015 $m^3$ to 0.025 $m^3$. As such, these chambers can form a low Q-factor resonance cavity, e.g. not more than 1000, 500, 200, 100, 80, or 50 in use. These dimensions are particularly preferred for operation at a microwave frequency in the range 800 MHz to 1000 MHz. For an operating frequency of 400 to 500 MHz, the volume of the resonance cavity may be in a range 0.018 $m^3$ to 0.530 $m^3$, 0.062 $m^3$ to 0.350 $m^3$, 0.089 $m^3$ to 0.270 $m^3$, or 0.133 $m^3$ to 0.221 $m^3$. For an operating frequency of 2300 to 2600 MHz, the volume of the resonance cavity may be in a range 9.8×$10^{-5}$ $m^3$ to 2.9×$10^{-3}$ $m^3$, 3.4×$10^{-4}$ $m^3$ to 1.96×$10^{-3}$ $m^3$, 4.9×$10^{-4}$ $m^3$ to 1.47×$10^{-3}$ $m^3$, or 7.35×$10^{-4}$ $m^3$ to 1.23×$10^{-3}$ $m^3$.

It should be noted that while terms such as "top", "base", "upper" and lower" are used in this specification when describing the plasma reactor, it is possible to invert the reactor. As such, these terms refer to the location of the reactor components relative to each other and not necessarily their location relative to the earth. For example, in standard usage, the substrate will be supported by the base of the chamber which will form the lower wall of the chamber relative to the earth. However, it is possible to invert the reactor such that the base of the chamber supporting the substrate will form the upper wall of the chamber relative to the earth. In the inverted orientation gas flow towards the substrate may be parallel to principle thermally driven convection currents (which are in an upwards direction due to the large amount of heat generated in the plasma which is below the substrate in an inverted arrangement). This inverted arrangement may have some benefits for certain applications.

In addition to the basic chamber dimensions discussed above, it has been found that the geometry of the substrate and/or substrate holder within the resonance cavity can affect the uniformity of the plasma formed in use. In particular, it has been found that the uniformity of the plasma can be further improved by ensuring that the substrate and/or substrate holder and the resonance cavity are configured to satisfy the condition that a ratio of a resonance cavity diameter/substrate (and/or substrate holder) diameter is in the range 1.5 to 5, 2.0 to 4.5, or 2.5 to 4.0, wherein the resonance cavity diameter is measured at a height less than 50%, 40%, 30%, or 20% of a height of the resonance cavity, e.g., as measured at a height of the supporting surface of the substrate holder or as measured at the growth surface of the substrate. For example, the substrate (or substrate holder) diameter may be in a range: 165 mm to 415 mm, 185 mm to 375 mm, 205 mm to 375 mm, 205 mm to 330 mm, or 240 mm to 330 mm for a microwave frequency f in the range 400 to 500 MHz; 80 mm to 200 mm, 90 mm to 180 mm, 100 mm to 180 mm, 100 mm to 160, or 115 mm to 160 mm for a microwave frequency f in the range 800 to 1000 MHz; or 30 mm to 75 mm, 33 mm to 65 mm, 37 mm to 65 mm, 37 mm to 58 mm, or 42 mm to 58 mm for a microwave frequency f in the range 2300 to 2600 MHz.

The aforementioned conditions assume that the substrate holder will be of a comparable size to the substrate in use. In practice, the substrate holder can be made with a larger diameter than the substrate to be used in a CVD diamond process. In that case, the uniformity of the plasma over the growth surface of the substrate will be primarily affected by the geometry of the substrate and thus the aforementioned diameter ranges may apply to the substrate only and not the substrate holder.

It should also be noted that the substrate holder may be formed by the base of the plasma chamber. The use of the term "substrate holder" is intended to cover such variations. Furthermore, the substrate holder may comprise a flat supporting surface which is the same diameter (as illustrated) or larger than the substrate. For example, the substrate holder may form a large flat surface, formed by the chamber base or a separate component disposed over the chamber base, and the substrate may be carefully positioned on a central region of the flat supporting surface. In one arrangement, the supporting surface of the substrate holder may have further elements, for example projections or grooves, to align, and optionally hold, the substrate. Alternatively, no such additional elements may be provided such that the substrate holder merely provides a flat supporting surface over which the substrate is disposed.

One potentially problem the inventors have found when using a small cavity arrangement as described above, is that of over heating in wall components of the chamber. As will be discussed in more detail below, it has been found to be advantageous to provide an arrangement in which the walls of the resonance cavity are exposed to the plasma in use, i.e. the plasma is not contained within a bell jar. Vacuum engineers have advised that plasma reactor vessels should be manufactured from welded stainless steel as this is the accepted material of choice for ultra-high vacuum (UHV) chambers. However, it has been found that this creates problems with arcing at interfaces, soot formation on hot surfaces, and generally poor heat transfer. Furthermore, these chambers cost a large amount of money to build. Aluminium has been found to be a better material thermally and is also easy to machine. Thus, while stainless steel is a good material for vacuum chambers, its very poor thermal performance makes it not well suited to use in areas where high power densities are experienced. Materials such as aluminium, while not traditionally regarded as suitable for high vacuum, are actually quite good for reasonably high vacuum usage where conventional elastomer seals can be used. As such, the resonance cavity is preferably made of aluminium or an alloy thereof which comprises at least 80%, 90%, 95%, or 98% by weight of aluminium.

Microwave Coupling Structure, Dielectric Window Shape and Location

Instabilities in the plasma can cause the plasma to "jump" and ignite process gases at other regions of high electric field away from the desired location immediately above the substrate. One solution to this problem is to use a bell jar to confine the process gases near the substrate. Because the process gases are at a significantly reduced pressure compared to the gases outside the bell jar the breakdown voltage is reduced such that the plasma can exist only within the bell-jar. The composition of the gas in the bell jar can also be chosen to assist breakdown at a lower electric field. However, using a bell jar presents its own problems. For example, silicon impurities from a quartz bell jar can become incorporated into the CVD diamond grown using such an arrangement leading to a degradation in product purity. Further still, bell jars tend to over-heat at high powers leading to reduced overall service life or in extreme cases catastrophic damage. This is at least partially due to the proximity of the plasma. A larger bell jar which is more removed from the plasma may partially solve this problem but such an arrangement is more prone to the effects of convection and therefore loss of plasma stability. Indeed, the present inventors consider that the problem of convection within the chamber (at least relatively complex and uncontrolled convection within the chamber) leading to loss of plasma stability is also apparent in large volume chambers which do not use a bell jar. This problem is solved by using a small, narrow diameter $TM_{011}$ cavity arrangement as previously described.

Feeding high power microwaves into such a small, narrow diameter $TM_{011}$ cavity without a bell jar can in itself create several problems. However, these problems can be overcome where necessary through further modification of the chamber in terms of how microwave power is coupled into the chamber and how the electric and magnetic fields are manipulated within the chamber. These further modifications are discussed below.

One problem is how to avoid plasma formation and electrical breakdown at an anti-node in the electromagnetic field away from the desired location immediately above the substrate. This problem is partially solved by providing a relatively small, narrow diameter $TM_{011}$ cavity as previously described such that relatively few electromagnetic anti-nodes will be present within the chamber. However, even using this $TM_{011}$ cavity design, there is still a second anti-node present in an upper portion of the chamber that is in effect a mirror image of the electric field that exists at the substrate end of the cavity.

There are several possible ways of alleviating the problem of plasma formation and electrical breakdown at the upper anti-node. For example, it has been found that there is less risk of plasma formation at the upper anti-node if the microwave power is inductively coupled, rather than capacitively coupled, into the chamber.

That said, Silva et al. identify that electric field (capacitive) coupling using an antenna is the most widely used and that magnetic (inductive) coupling is rarely used because of the limited power than can be coupled. The present inventors are interested in operating at high power to achieve high CVD diamond growth rates for a commercially useful industrial process. Accordingly, following the disclosure of Silva et al. a skilled person would be taught to use capacitive coupling. Contrary to this teaching, the present inventors have realized that if a relatively small, narrow chamber design is utilized, high power densities can be achieved even when using inductive coupling. Furthermore, by using inductive coupling the previously described problems associated with capacitive coupling can be alleviated. As such, the combination of inductive coupling and a small, narrow plasma chamber has been found to be advantageous in achieving high power densities, and thus high CVD diamond growth rates, while alleviating the problem of plasma formation at an upper anti-node in a resonant cavity.

The question remains as to how the microwaves should be inductively coupled into the chamber. One option is to inductively couple high power microwaves via a plate shaped dielectric window in an upper portion of the chamber in a similar manner to the ASTEX and LIMHP reactors discussed in the background section. However, it has been found that such a dielectric plate is damaged by high electric field regions in the upper central portion of the chamber in use and can lead to dielectric material contaminating CVD diamond grown using such an arrangement. This problem can be alleviated by feeding in microwave power through an annular dielectric window disposed at or near an end of the cavity. Several options are possible for the positioning of the annular window. The annular window can be positioned on an end wall of the chamber or on a side wall. In both cases similar regions of high magnetic field are being excited inductively. However, in contrast to the annular dielectric window disclosed in U.S. Pat. No. 6,645,343, the present inventors have found it preferable to position the annular window on an end wall of the chamber such that microwaves are coupled into the chamber in a direction parallel to the central rotational axis of the chamber.

It is considered to be advantageous to limit the area of dielectric material exposed to the plasma in use. For example, the resonance cavity may comprise internal walls configured to be exposed to a plasma formed within the resonance cavity in use, the internal walls comprising metallic surfaces forming at least 75%, 80%, 85%, 90% or 95% of a total surface area of the internal walls within the resonance cavity. As previously stated, the metallic surfaces are preferably made of aluminium. In a particularly advantageous arrangement, the resonance cavity has a small volume and a large proportion of the internal walls which are exposed to the plasma in use are formed by metallic surfaces. The volume of the resonance cavity may be in a range 0.002 $m^3$ to 0.06 $m^3$, 0.007 $m^3$ to 0.04 $m^3$, 0.01 $m^3$ to 0.03 $m^3$, or 0.015 $m^3$ to 0.025 $m^3$. These dimensions are particularly preferred for operation at a microwave frequency in the range 800 MHz to 1000 MHz. Again, these dimensions may be scaled according to the operating frequency. For example, for operation at a microwave frequency in the range 400 MHz to 500 MHz the values may be scaled by a factor of $2.07^3$ and for operation at a microwave frequency in the range 2300 MHz to 2600 MHz the values may be scaled by a factor of $0.366^3$. As such, at a microwave frequency f in the range 400 to 500 MHz the resonance cavity may have a volume in a range 0.018 $m^3$ to 0.530 $m^3$, 0.062 $m^3$ to 0.350 $m^3$, 0.089 $m^3$ to 0.270 $m^3$, or 0.133 $m^3$ to 0.221 $m^3$. At a microwave frequency f in the range 2300 to 2600 MHz the resonance cavity may have a volume in a range $9.8\times10^{-5}$ $m^3$ to $2.9\times10^{-3}$ $m^3$, $3.4\times10^{-4}$ $m^3$ to $1.96\times10^{-3}$ $m^3$, $4.9\times10^{-4}$ $m^3$ to $1.47\times10^{-3}$ $m^3$, or $7.35\times10^{-4}$ $m^3$ to $1.23\times10^{-3}$ $m^3$.

A relatively small portion of the internal walls may be formed by dielectric material for inductively coupling microwaves into the resonance cavity. A particularly advantageous arrangement comprises an annular dielectric window, formed in one or several sections, the annular dielectric window forming no more than 25%, 20%, 15%, 10%, or 5% of the total surface area of the internal walls within the resonance cavity.

Configurations for Stabilizing the Plasma Formed within the Reactor Chamber

Even when inductive coupling is used, there is still a risk of plasma formation in the upper part of the chamber. One way to further alleviate this problem is to provide an arrangement which at least partially eliminates the high electric field anti-node in the upper portion of the chamber without unduly affecting the high electric field region in the lower portion of the chamber. One way to achieve this is to provide an electrically conductive surface which extends into the chamber and over the upper anti-node. The electrically conductive surface may form a bowl of uniform curvature, a pointed cone, or any intermediate conical structure. A conical surface having a rounded tip is preferred. In one preferred arrangement, the conical surface is configured to be approximately orthogonal to the electric field vector of the resonance mode of the cavity thereby minimizing perturbations in the electric field as a result of the introduction of the conical surface into the resonance cavity. That is, it is possible to eliminate the anti-node without affecting the basic $TM_{011}$ electric field profile in the lower part of the chamber by placing a conductive metal surface approximately orthogonal to the electric field in the region of the upper high electric field anti-node to effectively eliminate the upper high electric field region. While the resonant frequency of the chamber should not be unduly altered, the Q factor will reduce due to a reduction in the stored energy in the cavity while the energy dissipated per cycle remains the same.

The electrically conductive surface can extend up to one quarter guided wavelength and may extend from the driven or non-driven end of the plasma chamber. By "driven-end", we mean the end where the microwaves are coupled into the chamber. An alternative possibility is to place the electrically conductive surface at the non-driven end resulting in an arrangement where the microwave window is positioned around the substrate although this arrangement could lead to damage of the dielectric window.

In light of the above, one configuration comprises a cone-shaped electrically conductive member extending into the resonance cavity to at least partially eliminate a high electric field anti-node in the resonance cavity in use as compared with an equivalent resonance cavity without the cone-shaped electrically conductive member present. The cone-shaped electrically conductive member may be supported by the base or the top plate of the plasma chamber and is oriented such that a tip of the cone-shaped electrically conductive member lies on the central rotational axis of symmetry of the resonance cavity. For example, the substrate holder may be supported by the base of the plasma chamber and the cone-shaped electrically conductive member can be supported by the top plate of the plasma chamber. In one particularly useful arrangement, the cone-shaped electrically conductive member forms an annular recess within the resonance cavity and the previously described annular dielectric window may be disposed within the annular recess. This arrangement is useful to prevent damage of the dielectric window in use.

The electrically conductive surface as described above is useful in providing a plasma chamber which effectively only has one primary electric field anti-node. That is, an electrically conductive surface can be provided which extends into the chamber to mask off all other primary electric field anti-nodes except the one located adjacent the growth surface of the substrate in use to improve mode purity and alleviate the problem of plasma formation away from the area of interest at the growth surface of the substrate. Such a single anti-node chamber is considered to be advantageous for manufacturing high quality synthetic diamond material over large areas. In this regard, it should be noted that the chamber may still comprise localized modes as a result of the presence of the substrate within the chamber. However, the resonance cavity can be designed so that only one primary electric field anti-node is supported by the walls of the chamber.

An alternative to the use of a cone-shaped electrically conductive surface to eliminate the high electric field region in the upper portion of the chamber is to provide a plasma chamber in which an upper portion of the resonance cavity has a larger diameter than a lower portion of the resonance cavity, the upper portion of the resonance cavity being configured to reduce a high electric-field anti-node in the upper portion of the resonance cavity in use. For example, the side wall of the chamber may be outwardly tapered in an upper portion of the chamber so as to reduce the upper anti-node of a $TM_{011}$ mode. The reduction in the $E_z$ component of the E-field is sufficient to prevent breakdown occurring in this region. Such a taper may run from the base of the chamber or may initiate part way up the chamber wall with a lower portion of the chamber remaining cylindrical. Alternatively still, a step may be provided in the side wall of the chamber to provide a broader upper portion. These arrangements also have the benefit of decreasing the power density in the upper portion of the chamber which alleviates the problem of plasma formation in the upper portion of the chamber. Accordingly, providing a broader upper portion to the plasma chamber has the effect of reducing the electric field in the upper portion of the chamber.

As an alternative, or in addition to the above, use of a gas inlet which is oriented to inject process gas from the top plate towards the growth surface of the substrate can aid in pushing the plasma down towards the substrate and prevent plasma jumping into an upper region of the chamber.

In light of the above, it is considered that the desired chamber design may fulfil the following design parameters:

(i) A small, narrow chamber designed to support a $TM_{011}$ resonance mode between a base and a top plate of the chamber is advantageous.

(ii) The microwave power may be inductively coupled into the chamber via a ring shaped dielectric window. Preferably the ring-shaped dielectric window is positioned on an end wall of the plasma chamber such that microwaves are coupled into the plasma chamber in a direction substantially parallel to the axis of the plasma chamber.

(iii) The chamber may be configured to at least partially cancel a large electric field anti-node in an upper portion of the chamber. This may be achieved using an electrically conductive cone-shaped surface or alternatively by broadening the diameter of the upper portion of the chamber to support a cancelling mode in an upper portion of the chamber. An axially disposed gas inlet can also aid in preventing plasma jumping to the upper anti-node. As such, the cone or taper may not be essential if axially oriented gas flow is utilized.

One useful arrangement is to combine the features of a ring-shaped microwave window and a centrally disposed cone. Another useful combination is a ring-shaped microwave window and an axially disposed gas inlet. Yet a further useful combination is the provision of all three of the aforementioned features, i.e. a ring-shaped microwave window, a centrally disposed cone, and an axially disposed gas inlet.

Embodiments of the present invention provide a plasma reactor chamber which is capable of forming a uniform, stable, large area plasma for achieving uniform CVD diamond growth over large areas.

EXAMPLES

FIG. 1 shows an example of a microwave plasma reactor as described herein. As can be seen by reference to FIG. 1, the microwave plasma reactors comprise the following basic components: a plasma chamber 2; a substrate holder 4 disposed in the plasma chamber for holding a substrate 5; a microwave generator 6, for forming a plasma 8 within the plasma chamber 2; a microwave coupling configuration 10 for feeding microwaves from the microwave generator 6 into the plasma chamber 2; and a gas flow system comprising a gas inlet 12 and a gas outlet 14 for feeding process gases into the plasma chamber 2 and removing them therefrom.

The microwave coupling configuration 10 comprises a coaxial line comprising an inner conductor 16 and outer conductor 18. The coaxial line is configured to transmit microwaves from the microwave generator 6 to an annular dielectric window 20. The dielectric window 20 is made of a microwave permeable material such as quartz. It forms a vacuum-tight annular window in a top portion of the plasma chamber 2. The microwave generator 6 and the microwave coupling configuration 10 are configured to generate a suitable wavelength of microwaves and inductively couple the microwaves into the plasma chamber 2 to form a standing wave within the plasma chamber 2 having a high energy node located just above the substrate 5 in use. A top plate 22 comprises one or more waveguides to transmit microwaves from the coaxial line through the dielectric window 20.

The dimensions of the plasma chamber 2, the microwave wavelength, and the position of the top plate 22 are selected to generate a $TM_{011}$ standing wave within the plasma chamber between the base of the chamber 2 and the top plate 22. The height h between the base 24 and the top plate 22 and the diameter d of the chamber are selected to have a ratio as previously defined.

The plasma chamber forms a tight microwave cavity with solid metal walls, preferably aluminium, which are exposed to the plasma in use. The walls of the plasma chamber may be fluid or gas cooled (e.g. water cooled) to enable higher power operation. This aids in removing the requirement for a bell jar to constrain the reactive species, allowing higher powers while also improving material purity.

Figure 2:
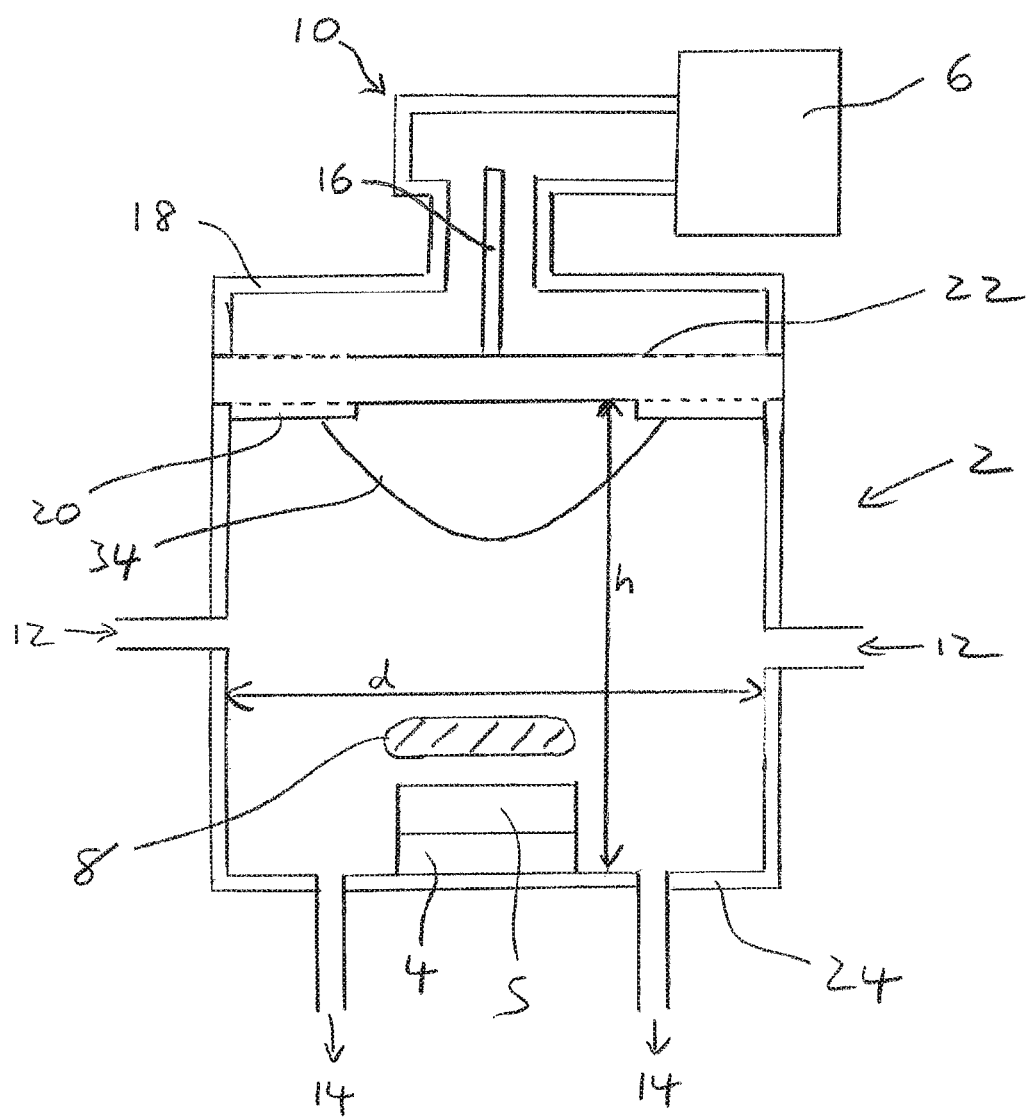
FIG. 2 shows a cross-sectional view of another microwave plasma reactor configured to deposit synthetic diamond material using a chemical vapour deposition technique in accordance with an embodiment of the present invention.

FIG. 2 shows a modified version of the plasma reactor illustrated in FIG. 1. In this modified arrangement an electrically conductive cone-shaped member 34 is mounted to the top plate 22 and extends into the plasma chamber. The electrically conductive cone-shaped member 34 is configured to effectively mask the high electric field anti-node of the $TM_{011}$ mode in an upper portion of the plasma chamber without unduly affecting the high electric field anti-node of the $TM_{011}$ mode in a lower portion of the plasma chamber.

Figure 3:
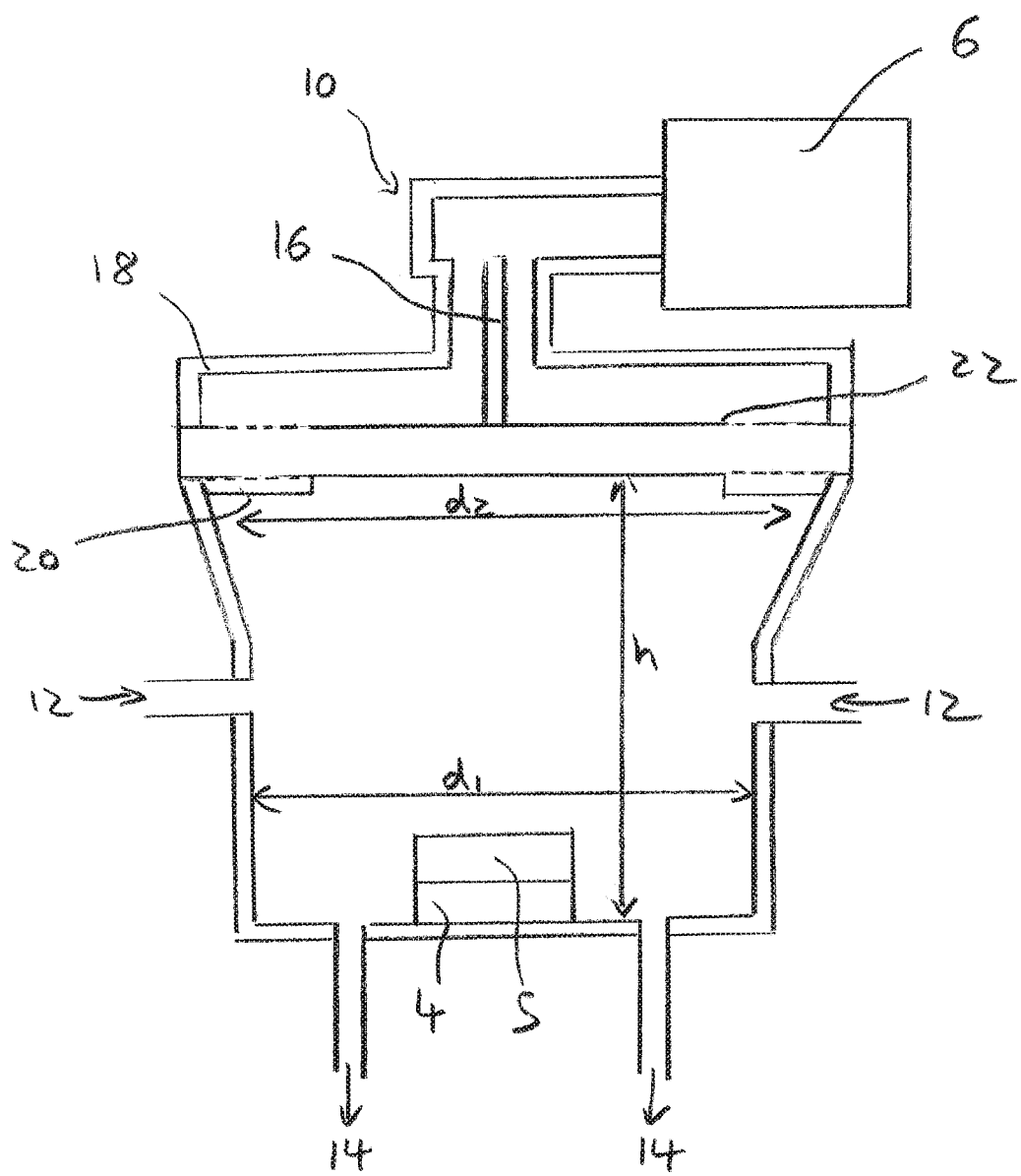
FIG. 3 shows a cross-sectional view of yet another microwave plasma reactor configured to deposit synthetic diamond material using a chemical vapour deposition technique accordance with an embodiment of the present invention.

FIG. 3 shows yet another alternative. In the illustrated arrangement the upper portion of the plasma chamber has a larger diameter $d_2$ than that of the lower portion of the plasma chamber $d_1$. The ratio of $d_1/d_2$ is selected to meet the design criteria as previously described. The upper diameter $d_2$ can be selected to support a secondary microwave mode which at least partially cancels the high electric field anti-node of the $TM_{011}$ mode in an upper portion of the plasma chamber.

Embodiments of the present invention improve uniformity in a CVD diamond growth process. Improvement in uniformity can be measured by one or more of the following parameters: thickness uniformity or a CVD diamond film (across the deposition area); uniformity of one or more quality parameters of the diamond material (e.g. colour, optical properties, electronic properties, nitrogen uptake, boron uptake, and/or boron activation level); in polycrystalline diamond material, uniformity of texture, surface morphology, grain size, etc . . . ; or in single crystal diamond material where growth takes place on an array of single crystal diamond substrates on a substrate carrier, uniformity of thickness, morphology, edge twinning, lateral growth, etc . . . , between each single crystal. The key parameters chosen for assessing uniformity depend on the synthesis process, the economics of fabricating the final product from the synthesis product, and the requirements of the final product itself.

While this invention has been particularly shown and described with reference to preferred embodiments, it will be understood to those skilled in the art that various changes in form and detail may be made without departing from the scope of the invention as defined by the appendant claims.

What is claimed is:

1. A microwave plasma reactor for manufacturing synthetic diamond material via chemical vapour deposition, the microwave plasma reactor comprising:
    a plasma chamber comprising a base, a top plate, and a side wall extending from said base to said top plate defining a resonance cavity for supporting a microwave resonance mode, wherein the resonance cavity has a central rotational axis of symmetry extending from the base to the top plate, and wherein the top plate is mounted across said central rotational axis of symmetry;
    a microwave coupling configuration for feeding microwaves from a microwave generator into the plasma chamber;
    a gas flow system for feeding synthetic diamond material process gases into the plasma chamber and removing them therefrom; and
    a substrate holder disposed in the plasma chamber and comprising a supporting surface for supporting a substrate on which the synthetic diamond material is to be deposited in use;
    wherein the resonance cavity is configured to have a height, as measured from the base to the top plate of the plasma chamber, which supports a $TM_{011}$ resonant mode between the base and the top plate at a frequency in the range 400 to 500 MHz, 800 to 1000 MHz, or 2300 MHz to 2600 Mz,
    wherein the resonance cavity is further configured to have a diameter, as measured at a height less than 50% of the height of the resonance cavity as measured from the base, which satisfies the condition that a ratio of the resonance cavity height/the resonance cavity diameter is in the range 0.3 to 1.0,
    wherein the resonance cavity comprises internal walls configured to be exposed to a plasma formed within the resonance cavity in use, said internal walls comprising metallic surfaces forming at least 75% of a total surface area of said internal walls within the resonance cavity,
    wherein a portion of said internal walls is formed by a dielectric window, formed in one or several sections, said dielectric window forming no more than 25% of the total surface area of the internal walls within the resonance cavity, and
    wherein the plasma chamber does not contain a quartz process gas confinement element; and
    wherein the microwave plasma reactor further comprises an electrically conductive non-planar surface located within the plasma chamber over a high electric field anti-node region which would exist in a corresponding plasma chamber which did not comprise the conductive surface.

2. A microwave plasma reactor according to claim 1, wherein the ratio of the resonance cavity height/the resonance cavity diameter is in the range 0.4 to 0.9 or 0.5 to 0.8.

3. A microwave plasma reactor according to claim 1, wherein the resonance cavity height, as measured from the base to the top plate of the plasma chamber, is in a range:
    300 mm to 600 mm, 300 mm to 500 mm, or 400 mm to 500 mm at a microwave frequency f in the range 400 MHz to 500 MHz;
    150 mm to 300 mm, 150 mm to 250 mm, or 200 mm to 250 mm at a microwave frequency f in the range 800 MHz to 1000 MHz; or
    50 mm to 110 mm, 50 mm to 90 mm, or 70 mm to 90 mm at a microwave frequency f in the range 2300 MHz to 2600 MHz.

4. A microwave plasma reactor according to claim 1, wherein the resonance cavity diameter is in the range:
    400 mm to 1000 mm, 500 mm to 900 mm, or 600 mm to 800 mm at a microwave frequency f in the range 400 MHz to 500 MHz;
    200 mm to 500 mm, 250 mm to 450 mm, or 300 mm to 400 mm at a microwave frequency f in the range 800 MHz to 1000 MHz; or
    70 mm to 180 mm, 90 mm to 160 mm, or 110 mm to 150 mm at a microwave frequency f in the range 2300 MHz to 2600 MHz.

5. A microwave plasma reactor according to claim 1, wherein the resonance cavity has a volume in a range:
    0.018 $m^3$ to 0.530 $m^3$, 0.062 $m^3$ to 0.350 $m^3$, 0.089 $m^3$ to 0.270 $m^3$, or 0.133 $m^3$ to 0.221 $m^3$ at a microwave frequency f in the range 400 to 500 MHz;

0.002 m³ to 0.06 m³, 0.007 m³ to 0.04 m³, 0.01 m³ to 0.03 m³, or 0.015 m³ to 0.025 m³ at a microwave frequency f in the range 800 MHz to 1000 MHz; or $9.8 \times 10^{-5}$ m³ to $2.9 \times 10^{-3}$ m³, $3.4 \times 10^{-4}$ m³ to $1.96 \times 10^{-3}$ m³, $4.9 \times 10^{-4}$ m³ to $1.47 \times 10^{-3}$ m³, or $7.35 \times 10^{-4}$ m³ to $1.23 \times 10^{-3}$ m³ at a microwave frequency f in the range 2300 to 2600 MHz.

6. A microwave plasma reactor according to claim 1, wherein the resonance cavity is cylindrical.

7. A microwave plasma reactor according to claim 1, wherein an upper portion of the resonance cavity has a larger diameter than a lower portion of the resonance cavity, the upper portion of the resonance cavity being configured to support at least one secondary microwave mode which at least partially eliminates a high electric-field anti-node in the upper portion of the resonance cavity in use.

8. A microwave plasma reactor according to claim 7, wherein a ratio of a lower diameter/an upper diameter of the resonance cavity is greater than 0.4 and less than 1, wherein the lower diameter is measured at a height less than 50% of the height of the resonance cavity as measured from the base and the upper diameter is measured at a height greater than 50% of the height of the resonance cavity as measured from the base.

9. A microwave plasma reactor according to claim 8, wherein said ratio is in a range 0.5 to 0.9, 0.6 to 0.9, or 0.7 to 0.8.

10. A microwave plasma reactor according to claim 9, wherein:
  at a microwave frequency f in the range 400 to 500 MHz the lower diameter lies in a range 400 mm to 900 mm, 500 mm to 900 mm, 600 mm to 800 mm, or 650 mm to 800 mm, and the upper diameter may lie in a range 600 mm to 1000 mm, 700 mm to 1000 mm, 700 mm to 900 mm, or 800 mm to 900 mm;
  at a microwave frequency f in the range 800 MHz to 1000 MHz the lower diameter lies in a range 200 mm to 450 mm, 250 mm to 450 mm, 300 mm to 400 mm, or 330 mm to 400 mm, and the upper diameter lies in a range 300 mm to 500 mm, 350 mm to 500 mm, 350 mm to 450 mm, or 400 mm to 450 mm; or
  at a microwave frequency f in the range 2300 to 2600 MHz the lower diameter lies in a range 70 mm to 160 mm, 90 mm to 160 mm, 100 mm to 150 mm, or 120 mm to 150 mm, and the upper diameter may lie in a range 100 mm to 200 mm, 120 mm to 200 mm, 130 mm to 170 mm, or 150 mm to 170 mm.

11. A microwave plasma reactor according to claim 1, wherein the metallic surfaces of the internal walls of the resonance cavity form at least 75%, 80%, 85%, 90% or 95% of a total surface area of said internal walls within the resonance cavity.

12. A microwave plasma reactor according to claim 11, wherein said metallic surfaces are made of aluminium or an alloy thereof comprising at least 80%, 90%, 95%, or 98% by weight of aluminium.

13. A microwave plasma reactor according to claim 11, wherein the dielectric window forms no more than 25%, 20%, 15%, 10%, or 5% of the total surface area of the internal walls within the resonance cavity.

14. A microwave plasma reactor according to claim 1, wherein the conductive surface is cone-shaped.

15. A microwave plasma reactor according to claim 14, wherein the cone-shaped conductive surface comprises a rounded tip.

16. A microwave plasma reactor according to claim 1, wherein the dielectric window is annular.

* * * * *

UNITED STATES PATENT AND TRADEMARK OFFICE
CERTIFICATE OF CORRECTION

PATENT NO. : 11,488,805 B2
APPLICATION NO. : 16/457138
DATED : November 1, 2022
INVENTOR(S) : John Robert Brandon et al.

It is certified that error appears in the above-identified patent and that said Letters Patent is hereby corrected as shown below:

In the Claims

Column 18, Line 10, Claim 1, replace "2300 MHz to 2600 Mz," with -- 2300 MHz to 2600 MHz, --.

Signed and Sealed this
Fourteenth Day of February, 2023

Katherine Kelly Vidal
*Director of the United States Patent and Trademark Office*